(12) United States Patent
De Ridder et al.

(10) Patent No.: US 7,740,437 B2
(45) Date of Patent: Jun. 22, 2010

(54) PROCESSING SYSTEM WITH INCREASED CASSETTE STORAGE CAPACITY

(75) Inventors: Christianus Gerardus Maria De Ridder, BK Hoogland (NL); Edwin den Hartog, PZ Utrecht (NL)

(73) Assignee: ASM International N.V. (NL)

(*) Notice: Subject to any disclaimer, the term of this patent is extended or adjusted under 35 U.S.C. 154(b) by 763 days.

(21) Appl. No.: 11/525,724

(22) Filed: Sep. 22, 2006

(65) Prior Publication Data

US 2008/0075562 A1  Mar. 27, 2008

(51) Int. Cl.
*B65G 49/07* (2006.01)
(52) U.S. Cl. .................... 414/217.1; 414/940
(58) Field of Classification Search ........... 414/940, 414/217.1
See application file for complete search history.

(56) References Cited

U.S. PATENT DOCUMENTS

| | | | |
|---|---|---|---|
| 3,260,381 A | 7/1966 | Wagner et al. | |
| 4,002,055 A | 1/1977 | Kops | |
| 4,590,103 A | 5/1986 | Ahne et al. | |
| 4,676,637 A | 6/1987 | Uto et al. | |
| 4,719,125 A | 1/1988 | Anello et al. | |
| 4,775,281 A | 10/1988 | Prentakis | |
| 4,804,086 A | 2/1989 | Gohrock | |
| 4,815,912 A | 3/1989 | Maney et al. | |
| 4,836,905 A | 6/1989 | Davis et al. | |
| 4,886,412 A | 12/1989 | Wooding et al. | |
| 4,886,975 A | 12/1989 | Murakami et al. | |
| 4,995,430 A | 2/1991 | Bonora et al. | |
| 5,003,062 A | 3/1991 | Yen | |
| 5,024,570 A | 6/1991 | Kiriseko et al. | |

(Continued)

FOREIGN PATENT DOCUMENTS

JP  63-102225  5/1988

(Continued)

OTHER PUBLICATIONS

Slettehaugh et al., "Impact of Lot Buffering on Overall Equipment Effectiveness", *Semiconductor International*; Jul. 1998; 5 pages.

(Continued)

*Primary Examiner*—James Keenan
(74) *Attorney, Agent, or Firm*—Knobbe, Martens, Olson & Bear LLP (57) ABSTRACT

A system for processing semiconductor substrates includes a front-end with at least two vertical levels of input/output ports for transferring substrate cassettes into or out of the housing of the processing system. The front-end also includes at least one level of storage positions, e.g., two levels of storage positions, which can be disposed between the two vertical levels of the input/output ports. The two vertical levels of storage positions can each be provided with two storage positions and each of two levels of input/output ports can be provided with accommodations for two cassettes, allowing for a total of eight cassettes to be accommodated at the front-end of the processing system. Inside the housing of the processing system, interior storage positions can be provided adjacent a wafer handling chamber and spaced apart from a cassette store having rotary platforms for housing cassettes. A single cassette handler can be used to access cassettes at each of the input/output ports and the interior storage positions.

26 Claims, 5 Drawing Sheets

U.S. PATENT DOCUMENTS

| | | | |
|---|---|---|---|
| 5,178,639 A | 1/1993 | Nishi | |
| 5,180,273 A | 1/1993 | Sakaya et al. | |
| 5,321,634 A | 6/1994 | Obata et al. | |
| 5,359,407 A | 10/1994 | Suzuki et al. | |
| 5,407,449 A | 4/1995 | Zinger | |
| 5,463,459 A | 10/1995 | Morioka et al. | |
| 5,464,313 A | 11/1995 | Ohsawa | |
| 5,539,514 A | 7/1996 | Shishido et al. | |
| 5,547,328 A | 8/1996 | Bonora et al. | |
| 5,570,987 A | 11/1996 | McKenna | |
| 5,625,170 A | 4/1997 | Poris | |
| 5,653,565 A | 8/1997 | Bonora et al. | |
| 5,740,845 A | 4/1998 | Bonora et al. | |
| 5,855,681 A | 1/1999 | Maydan et al. | |
| 5,857,827 A | 1/1999 | Asakawa et al. | |
| 5,872,632 A | 2/1999 | Moore | |
| 5,897,710 A | 4/1999 | Sato et al. | |
| 5,909,276 A | 6/1999 | Kinney et al. | |
| 5,934,856 A | 8/1999 | Asakawa et al. | |
| 5,940,175 A | 8/1999 | Sun | |
| 5,943,130 A | 8/1999 | Bonin et al. | |
| 5,944,940 A | 8/1999 | Toshima | |
| 5,957,648 A * | 9/1999 | Bachrach | 414/217 |
| 5,963,315 A | 10/1999 | Hiatt et al. | |
| 5,965,679 A | 10/1999 | Godschalx et al. | |
| 6,007,675 A | 12/1999 | Toshima | |
| 6,042,324 A | 3/2000 | Aggarwal et al. | |
| 6,053,688 A | 4/2000 | Cheng | |
| 6,079,927 A | 6/2000 | Muka | |
| 6,084,664 A | 7/2000 | Matsumoto et al. | |
| 6,102,647 A | 8/2000 | Yap | |
| 6,166,801 A | 12/2000 | Dishon et al. | |
| 6,169,935 B1 * | 1/2001 | Iwasaki et al. | 700/214 |
| 6,186,723 B1 | 2/2001 | Murata et al. | |
| 6,194,234 B1 | 2/2001 | Huang et al. | |
| 6,204,917 B1 | 3/2001 | Smedt | |
| 6,244,812 B1 | 6/2001 | Patterson et al. | |
| 6,261,044 B1 | 7/2001 | Fosnight et al. | |
| 6,267,853 B1 | 7/2001 | Dordi et al. | |
| 6,273,261 B1 | 8/2001 | Hosoi | |
| 6,284,986 B1 | 9/2001 | Dietze et al. | |
| 6,286,685 B1 | 9/2001 | Kononchuk et al. | |
| 6,291,252 B1 | 9/2001 | Yu et al. | |
| 6,309,831 B1 | 10/2001 | Goldberg et al. | |
| 6,422,247 B2 | 7/2002 | Yoshikawa et al. | |
| 6,439,822 B1 | 8/2002 | Kimura et al. | |
| 6,447,232 B1 | 9/2002 | Davis et al. | |
| 6,501,070 B1 | 12/2002 | Bacchi et al. | |
| 6,519,502 B2 | 2/2003 | Chao | |
| 6,540,466 B2 * | 4/2003 | Bachrach | 414/217 |
| 6,544,338 B1 | 4/2003 | Batchelder et al. | |
| 6,549,825 B2 | 4/2003 | Kurata | |
| 6,582,174 B1 | 6/2003 | Hayashi | |
| 6,592,318 B2 | 7/2003 | Aggarwal | |
| 6,607,602 B1 | 8/2003 | Granneman et al. | |
| 6,632,068 B2 | 10/2003 | Zinger et al. | |
| 6,634,116 B2 | 10/2003 | Kato et al. | |
| 6,663,332 B1 | 12/2003 | Sluijk et al. | |
| 6,678,583 B2 | 1/2004 | Nasr et al. | |
| 6,748,293 B1 | 6/2004 | Larsen | |
| 6,753,945 B2 | 6/2004 | Heerens et al. | |
| 6,897,124 B2 | 5/2005 | Tate et al. | |
| 6,902,647 B2 | 6/2005 | Hasper | |
| 6,979,165 B2 | 12/2005 | Larson et al. | |
| 6,981,832 B2 | 1/2006 | Zinger et al. | |
| 7,028,565 B2 | 4/2006 | Birkner et al. | |
| 7,278,813 B2 | 10/2007 | Davis et al. | |
| 7,591,624 B2 * | 9/2009 | Campbell et al. | 414/217 |
| 2002/0037645 A1 | 3/2002 | Matsunaga et al. | |
| 2003/0091409 A1 | 5/2003 | Danna et al. | |
| 2003/0192900 A1 | 10/2003 | Petzitillo et al. | |
| 2003/0194297 A1 | 10/2003 | Sackett et al. | |
| 2003/0235486 A1 | 12/2003 | Doherty et al. | |
| 2005/0063797 A1 | 3/2005 | Lero et al. | |
| 2005/0079042 A1 | 4/2005 | Maeda | |
| 2005/0232727 A1 | 10/2005 | Ferrera | |
| 2006/0045662 A1 | 3/2006 | Aalund | |
| 2006/0045663 A1 | 3/2006 | Aggarwal et al. | |
| 2006/0045664 A1 | 3/2006 | Niewmierzycki et al. | |

FOREIGN PATENT DOCUMENTS

| | | |
|---|---|---|
| JP | 63-143105 | 6/1988 |
| JP | 5-047896 | 2/1993 |
| WO | WO 99/38199 | 7/1999 |
| WO | WO 01/80289 A1 | 10/2001 |

OTHER PUBLICATIONS

Provisional Specification for 300-mm Front-Opening Interface Mechanical Standard (FIMS), SEMI E62-0997, SEMI 1997.

* cited by examiner

PROCESSING SYSTEM WITH INCREASED CASSETTE STORAGE CAPACITY

FIELD OF THE INVENTION

The invention relates to semiconductor substrate processing and, more particularly, to storage of substrate carriers in a processing system.

BACKGROUND OF THE INVENTION

Semiconductor fabrication systems are under constant pressure to increase throughput. This pressure is due to many factors, including the expense associated with operating semiconductor fabrication equipment and the desire to maximize the yield of substrates processed in the equipment.

A semiconductor fabrication system can include various stations and pieces of equipment housed in a clean room. For example, such a system can include reactors, robots for handling semiconductor substrates and cassettes which hold the substrates, input/output ports in system front-ends for bringing substrates into and sending substrates out of the system, storage units, metrology tools, etc. Each station or piece of equipment has the potential to cause a bottleneck to the flow of substrates through the system, thereby degrading the throughput of the system as a whole.

Accordingly, a need exists for apparatus and methods that minimize bottle-necks in a semiconductor fabrication system.

SUMMARY OF THE INVENTION

According to one aspect of the invention, a semiconductor substrate processing system is provided. The system comprises a housing for separating the system from a surrounding clean room. A reactor is provided within the housing and a front-end for loading substrate cassettes into the housing. The front end is disposed adjacent to and in front of the housing. The front-end comprises at least one lower input/output port allowing cassettes access from the clean room into the housing; at least one upper input/output port disposed above the at least one lower input/output port and allowing cassettes access from the clean room into the housing; and at least one cassette storage position disposed at a vertical level between the at least one lower input/output port and the at least one upper input/output port. The storage position is configured to receive cassettes transported out of the housing and configured to allow cassette transport into the housing.

According to another aspect of the invention, a loading station for a batch semiconductor fabrication system is provided. The loading station comprises a lower input/output port for holding a substrate cassette and which is configured to allow cassette access into a housing of the semiconductor fabrication system. The loading station also includes an upper input/output port for holding a substrate cassette. The upper input/output port is disposed above the lower input/output port and is configured to allow cassette access into the housing. The loading station also includes at least one storage position for holding a substrate cassette. The at least one storage position is disposed vertically between the lower input/output port and the upper input/output port.

According to yet another aspect of the invention, a method for semiconductor fabrication is provided. The method comprises providing a semiconductor fabrication system having a loading station for loading cassettes into a housing of the system. A first cassette is held at a first vertical level at the loading station. A second cassette is held at a second vertical level at the loading station. The method also includes holding a third cassette at a third vertical level at the loading station.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Typically, substrates to be processed in semiconductor processing or fabrication systems are delivered to the systems in cassettes. The cassettes can be loaded into the housing of the processing system via the front-end of the system, which can include two input/output ports in some systems. Once inside the housing, substrates, such as semiconductor wafers, can be taken out of the cassettes and loaded into a reactor for processing in the reactor. Thus, the supply of substrates to the reactors depends partly upon the supply of cassettes to the system front-end.

It has been found that processing systems that process substrates quickly, such as dual reactor systems, can process substrates more quickly than unprocessed substrates can be delivered to and supplied through access ports of the front-end. As a result, the reactors can remain idle while unprocessed substrates are provided to the reactors. Thus, the ability to supply cassettes with unprocessed substrates to the processing system can be a bottleneck which decreases the throughput of the system. Semiconductor fabrication systems containing two reactors within a common housing are disclosed in U.S. Pat. Nos. 6,607,602 and 6,632,068. The entire disclosures of each of these patents are incorporated herein by reference.

Preferred embodiments of the invention increase throughput and minimize bottlenecks caused by shortages of unprocessed substrates by increasing the number of cassettes available to a system. The front-end of the system is provided with input/output (I/O) ports on at least two different vertical levels. Storage positions for substrate carriers, such as cassettes, can be provided on another vertical level. Preferably, the storage positions are provided on a vertical in between the levels of those input/output ports. Preferably, two levels of storage positions, each level preferably having two storage positions, are provided. In addition, each level of input/output ports preferably comprises two positions, the second position either being an additional input/output port or a storage position. Thus, a total of eight positions accommodating a total of eight substrate carriers can be provided at the front-end. In some embodiments, each of the input/output ports and the storage positions can be accessed by the same substrate carrier handler within the system, thereby facilitating loading and unloading of carriers into and out of the system. Preferably, the top level of input/output ports is set at the maximum height allowed under SEMI standards.

In addition, it will be appreciated that in processing systems in which cassettes are taken into the interior of the processing system, substrates will typically need to be unloaded from the cassettes for processing and then loaded back into the cassettes after processing. The time required to supply cassettes with unprocessed wafers to the substrate transfer station and to remove cassettes with processed wafers from the substrate transfer station, can create a bottleneck. In some embodiments, additional storage positions can be provided inside the processing system, adjacent a station for transferring substrates into or out of cassettes, to minimize the time required to transport cassettes to and from the substrate transfer station.

Advantageously, the preferred embodiments allow for an increase in the number of cassettes immediately available at the front-end of a processing system, thereby removing a potential bottleneck at the front-end of the processing system. Also, by vertically distributing additional input/output ports and storage positions over existing input/output ports, the footprint of the processing system is unchanged, thereby preserving valuable floor space in a fabrication facility. Moreover, compliance with SEMI standards allows compatibility with other existing ancillary systems to be maintained. In addition, the additional storage positions inside the processing system can further increase the number of cassettes available to the processing system, thereby further reducing any bottlenecks.

Reference will now be made to the Figures, in which like numerals refer to like parts throughout.

Figure 1:
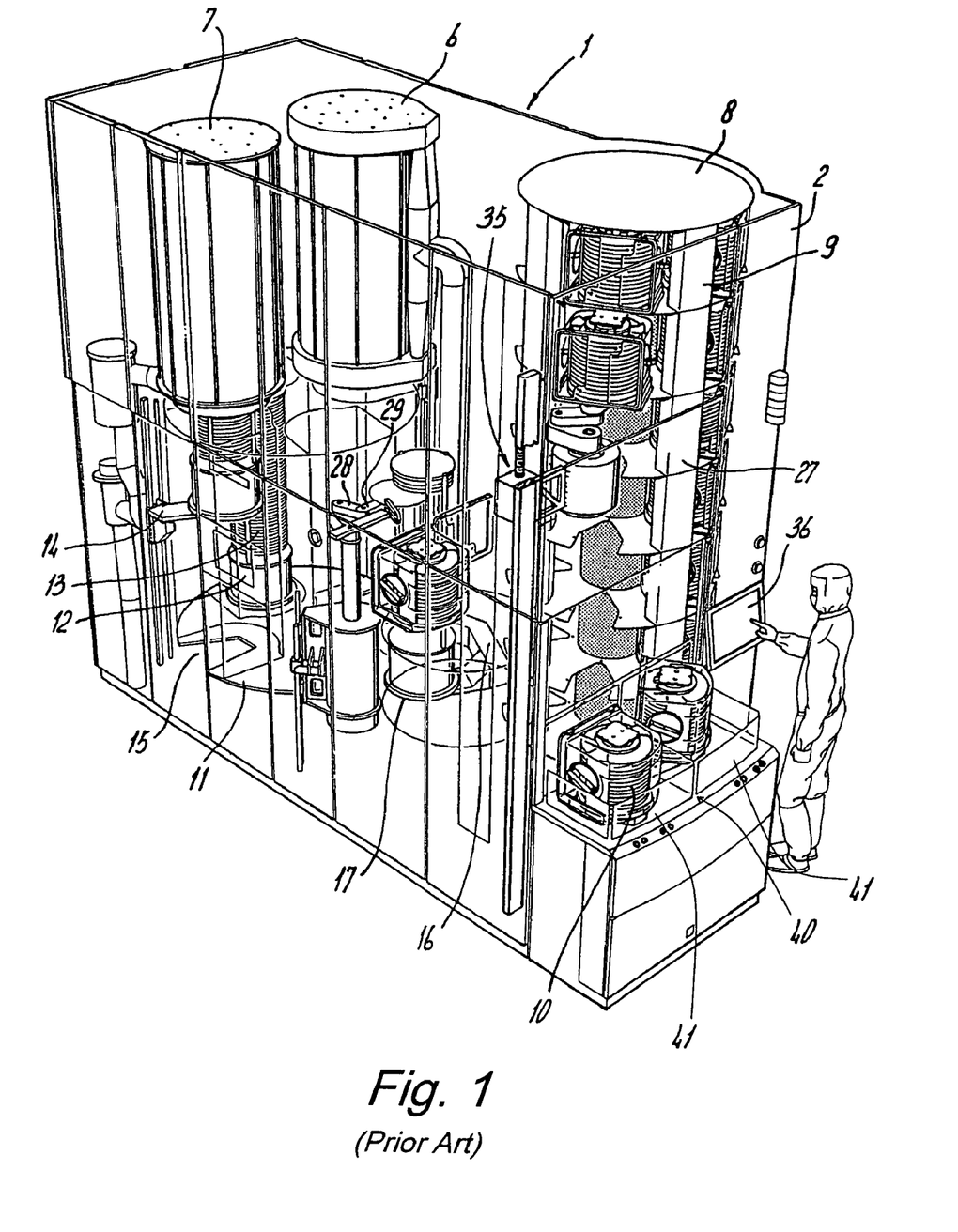
FIG. 1 is a perspective view of a semiconductor fabrication system, constructed in accordance with the prior art.
Figure 2:
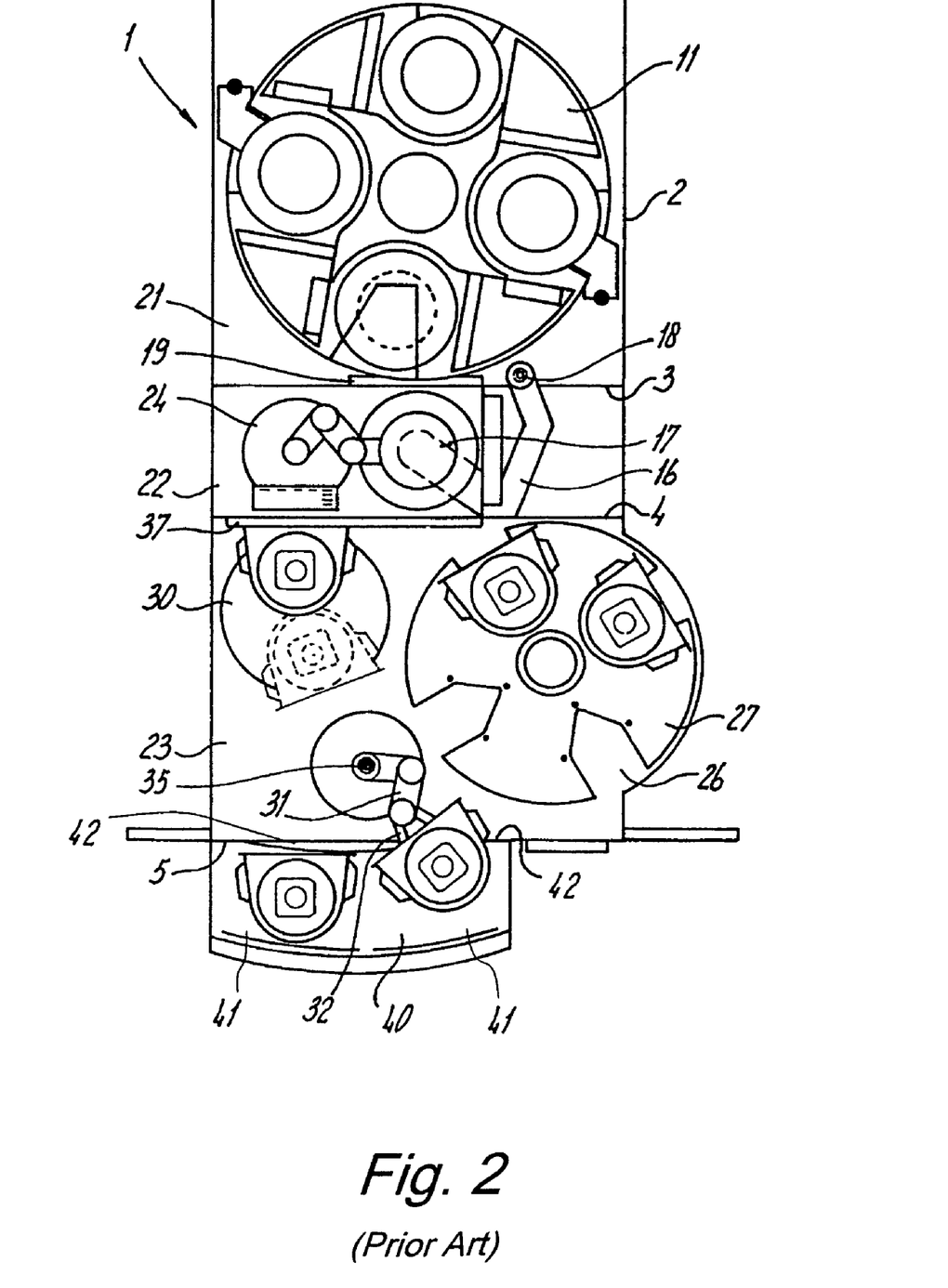
FIG. 2 is a schematic top plan view of the system of FIG. 1.

With reference to FIGS. 1 and 2, a wafer processing system according to the prior art is described. The subsequent figures and corresponding text below illustrate how the preferred embodiment is adapted to this particular wafer processing system. The skilled artisan will readily appreciate, however, that the principles and advantages of the I/O ports and storage positions described herein can be readily adapted to other processing systems where substrates are supplied to the system in holders such as cassettes.

FIG. 1 shows, diagrammatically and partially exposed, a perspective view and FIG. 2 shows a plan view of a wafer processing system for processing, e.g., 300-mm wafers supplied in 300-mm FOUP cassettes, according to the prior art. The wafer processing system is indicated in its entirety by reference numeral 1. This system 1 comprises a housing 2 and is generally installed in a so-called "clean room." In addition to the housing 2, partitions 3, 4 and 5 are also present. The housing 2 delimits, with the partition 3, a processing area or chamber 21. In this example, the processing area 21 comprises vertical furnaces 6, 7. The housing 2 and the partitions 3 and 4 define a wafer handling chamber or station 22. A cassette transfer chamber 23 is defined within the housing 2 between partitions 4 and 5.

An input/output station 40 for transferring cassettes 10 into and out of the system 1, is disposed adjacent to and in front of the cassette transfer chamber 23. The input/output station 40 can also be referred to as a front end, as it is located at a front, or entrance to, the processing system 1. The input/output station 40 includes two input/output ports 41, each port comprising a platform to support a cassette and a closeable opening 42 which allow cassettes 10 access into the interior of the housing 2. The cassettes can be, e.g., a 300-mm FOUP cassette, for holding 300-mm substrates, or a 200-mm open cassette, for holding 200-mm substrates. The system 1 is preferably provided with a tool set which allows it to interface with either 300-mm FOUP cassettes or 200-mm open cassettes. Such a tool set is described in U.S. Pat. No. 6,632,068, the entire disclosure of which is incorporated herein by reference.

Wafers 13 are supplied in cassettes 10, which are placed on the input/output station, or system front-end, 40 from the clean room side. The cassettes are placed coplanar, the side from which the wafers can be removed being substantially parallel with the partition 5 and facing the closeable openings 42. Then the cassettes are rotated so that the side from which the wafers can be removed is oriented perpendicular to a radial extension direction of the cassette handling device 31. In FIGS. 1 and 2 the cassette on the right input/output position is shown in such a rotated orientation and the cassette on the left input/output position is shown in a coplanar orientation. Then the cassette handling device 31 within the cassette transfer chamber 23 grips and transfers the cassettes 10 from the input/output station 40 through the closable opening 42 into a cassette store 8 located in the cassette transfer chamber 23. The cassette store 8 is provided with a number of rotary platforms 27 above one another, on which the cassettes 10 are stored. The cassette handling device 31 is movable in a vertical direction by means of an elevator 35 so that the different platforms 27 can be reached. The cassette handling device 31 is provided with a cassette end effector 32, which has dimensions a little smaller than those of a series of cut-outs 26 in the rotary platforms 27. After the cassette handling device 31 has transferred a cassette 10 into the store 8, the end effector 32 can be lowered through one of the cut-outs 26 in one of the platforms 27 to place the cassette 10 on the platform 27. Subsequently, the cassette handler 31 can be retracted from cassette store 8. The cassette handling device 31 is mounted such that it is able to transfer cassettes between the input/output station 40 and the store 8. The device 31 is also capable of transferring cassettes between the store 8 and a rotatable cassette transfer platform 30, or between the input/output station 40 and the rotatable cassette transfer platform 30.

The rotatable cassette transfer platform 30 is constructed such that, on rotation, the cassette 10 is placed against the partition 4 between the cassette transfer chamber 23 and the wafer handling chamber 22. The partition 4 is provided with an openable closure and a closure mechanism, together forming an interface schematically indicated by reference numeral 37. The interface 37 is preferably configured for 300-mm FOUP cassettes. After placing the cassette 10 against the interface 37 in the partition 4, the closure mechanism grips and unlocks the closure of the FOUP cassette 10 and simultaneously opens the closure in the partition 4 and the closure of the FOUP cassette 10, thereby allowing a wafer handling device 24 within the wafer handling chamber 22 to access substrates in the FOUP cassette 10.

The wafer handling device 24 transfers wafers between a cassette 10 and a wafer boat 12. After completion of the loading of wafers into the wafer boat 12, a boat transfer arm 16 moves the wafer boat 12 through a closable opening in partition 3 from the wafer handling chamber 22 into the processing chamber 21. The processing chamber 21 is provided with a rotary boat transfer platform 11, supporting the wafer boat 12. Two reactors, which in this case comprise furnaces 6, 7, are arranged in the processing chamber 21. The furnaces 6, 7 are positioned vertically and wafer boats, indicated by 12, filled with wafers 13, are introduced into the furnaces 6, 7 in the vertical direction from below. To this end, each furnace 6, 7 has an insertion arm 14, which is movable in the vertical direction. Only one insertion arm 14 is illustrated in FIG. 1.

The treatment of a large number of wafers can be carried out as follows: The operator, shown diagrammatically in FIG.

1, loads the store 8 by introducing a number of cassettes 10 on the input/output station 40 and carrying out control operations on a control panel 36. The illustrated input/output station 40 has two input/output ports 41, each input/output port provided with a closeable opening 42, through which a cassette 10 can be received into the cassette transfer chamber 23. Each of the cassettes 10 is transferred from the input/output station 40, through a closeable opening, with the aid of the cassette handling device 31 into the storage compartments 9 made for these cassettes 10 in the store 8, specifically on the stacked rotary platforms 27. By rotation of the store 8 and use of the elevator 35, it is possible to fill various compartments with the cassettes 10. After filling the store 8, no further human interaction is required with this automated installation.

The cassettes 10 concerned are then removed from the store 8 by the cassette handling device 31 and placed on the cassette transfer platform 30. The cassette transfer platform 30 comprises two levels, schematically indicated in FIG. 1, each level capable of receiving a FOUP cassette 10, where the two levels can be rotated independently of one another. Upon rotation of the cassette transfer platform 30, the cassettes 10 are placed against partition 4. After opening of the closure of the FOUP cassette 10, together with the closure 37 in partition 4, the wafers are removed by the wafer handler 24 and placed in a wafer boat 12. After the wafer boat 12 has been filled, and becomes available for one of the reactors 6, 7, the closure 19 in partition 3 is opened and the wafer boat 12 is placed on the rotary boat transfer platform 11 by the boat transfer arm 16. The boat transfer platform 11 then moves the wafer boat 12 within the process chamber 21 to a position below the reactor to be loaded. Then the insertion mechanism or elevator 14 moves the boat into the reactor 6 or 7. Treated wafers execute a movement which is the reverse of the movement described above.

This system is described in further detail in published PCT application WO 99/38199 and U.S. Pat. No. 6,663,332, the entire disclosures of which are incorporated herein by reference. Although an operator is described as introducing the cassette 10 on the input/output station 40, the system is designed such that the cassettes 10 can alternatively be introduced on the input/output station by means of an automatic guided vehicle (AGV) or by an overhead hoist system, which are known in the art. In such cases, the control system of the wafer processing system can be connected to a host computer system that carries out the control functions. In such arrangements, no human interaction at the wafer processing system is required.

Figure 3:
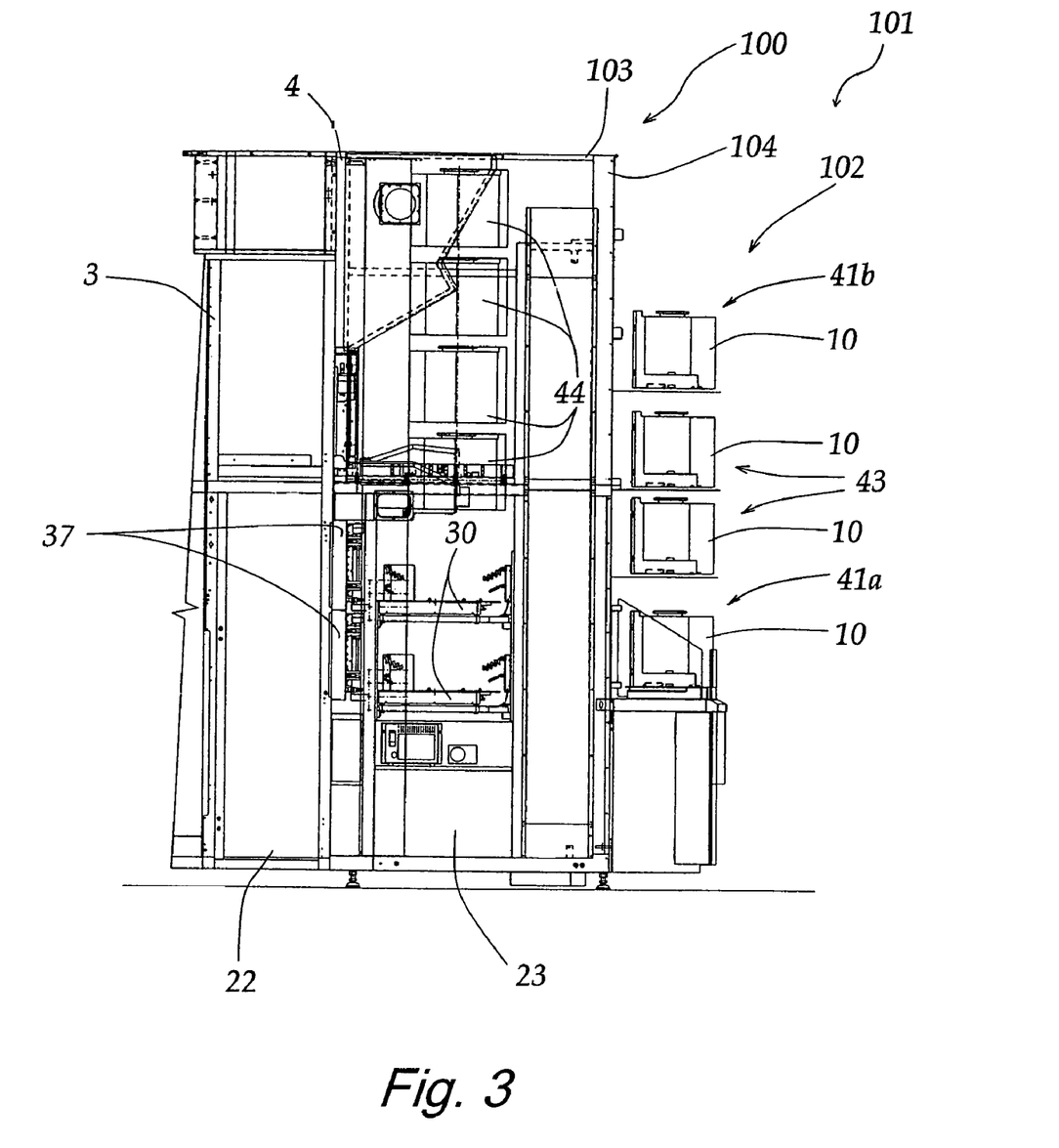
FIG. 3 is a schematic side view of a system in accordance with preferred embodiments of the invention.
Figure 4:
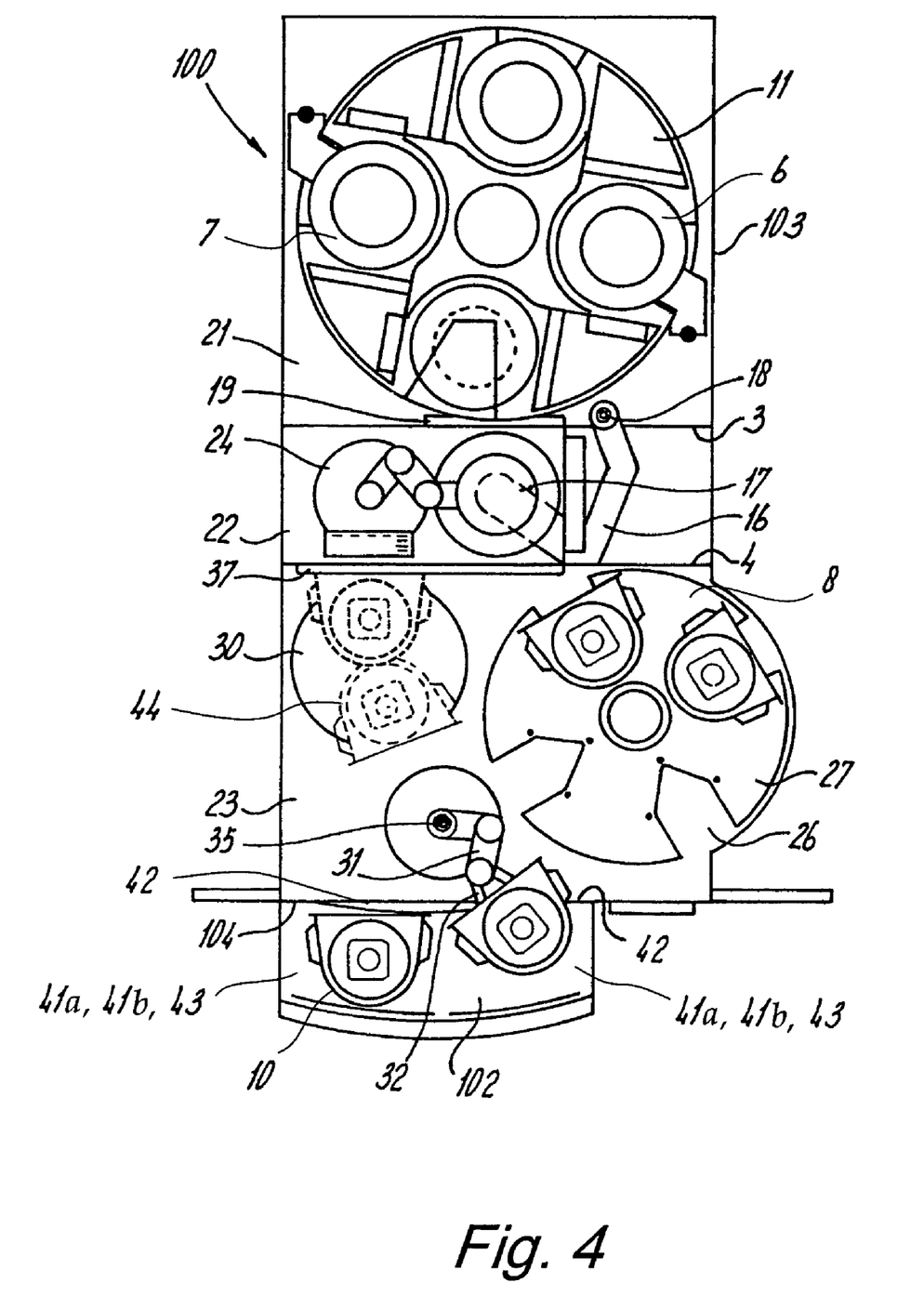
FIG. 4 is a schematic top plan view of the system of FIG. 3, in accordance with preferred embodiments of the invention.

FIGS. 3-5E show a system 100 according preferred embodiments, which have features of FIGS. 1 and 2. Illustrated features corresponding to those of the previously described system are referenced by similar reference numerals. FIGS. 3, 4 and 5 illustrate schematic side, top plan and front views, respectively, of the system 100.

With reference to FIGS. 3 and 4, the system 100 is provided within a clean room 101. The system 100 has a front-end 102 for receiving and storing cassettes 10, which can be, e.g., 300-mm FOUP cassettes and/or 200-mm cassettes. The front-end 102 is provided with input/output ports 41a, 41b which allow cassettes 10 access into the housing 103 across the front-end partition 104. Partitions 104 and 4, along with the housing 103, define the cassette transfer chamber 23. Farther away from the front-end 102, partitions 4 and 3, along with the housing 103, define the wafer handling chamber or station 22. The partition 3, with the housing 103, then delimits the processing area or chamber 21. In the illustrated embodiment, the processing area 21 comprises two vertical furnaces 6, 7 (FIG. 4).

The front-end 102 includes one or more lower input/output ports 41a, and one or more upper input/output ports 41b, the lower and upper input/output ports 41a, 41b disposed on two different vertical levels. In addition, at least one storage position 43 is provided. In the illustrated embodiment, two vertical levels of storage positions 43 are provided. The storage positions 43 are preferably disposed on a vertical level between upper input/output port 41b and lower input/output port 41a. The lower input/output port 41a is preferably positioned at a height specified by SEMI standards (SEMI E15.1, incorporated herein by reference) and the upper input/output port 41b is preferably positioned at the maximum height allowed under SEMI E15.1, thereby advantageously accommodating the two vertical levels of storage positions 43 while still maintaining compatibility with other equipment in existing processing system installations, particularly standard overhead hoist vehicle (OHV) systems. Preferably, in accordance with SEMI E15.1, the bottom of the lower input/output port 41a is 900 mm±about 10 mm above the clean room floor, and the upper input/output port 41b is positioned so that the top of a cassette at the upper input/output port 41b is about 2600 mm above the clean room floor.

As illustrated, the input/output ports 41a, 41b can be coplanar, to receive a cassette from the clean room side such that the cassette side from which the wafers can be removed is disposed parallel to partition 102 and to openable closures 42 in partition 104. After receipt, the cassette is rotated so that the cassette side from which the wafers can be removed is oriented perpendicular to a radial extension direction of the cassette handling device 31 to facilitate gripping by cassette handling device 31. This rotation can be performed by a rotatable platform supporting the cassettes at the input/output ports 41a, 41b. Alternatively, instead of rotating the cassette, the rotation can be performed by providing the end effector 32 of the cassette handling device 31 with a rotatable connection to the extendable arm and rotating the end effector. In FIG. 3, the storage positions 43 are shown in a coplanar orientation relative to partition 102 for ease of illustration. Preferably, the storage positions 43 are oriented slightly rotated in a horizontal plane relative to the orientation illustrated in FIG. 3 so that the side from which the wafers can be removed is oriented perpendicular to a radial extension direction of the cassette handling device 31 (see FIG. 5B). Preferably, the storage positions 43 are fixed, and not provided with a rotation mechanism. Preferably, the input/output ports 41a, 41b and the storage positions 43 have fixed vertical positions relative to one another, such that cassettes 10 held at the input/output ports 41a, 41b and the storage positions 43 are also in a fixed vertical position relative to one another. For example, the input/output ports 41a, 41b and the storage positions 43 can include platforms, as shown, or other devices for mechanically supporting the cassettes 10.

Figure 5A:
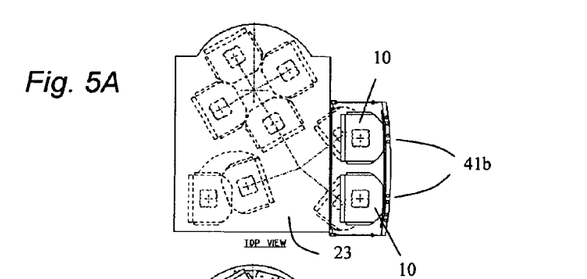
FIGS. 5A-5E are further schematic top plan, side and front views of a system in accordance with preferred embodiments of the invention.
Figure 5B:
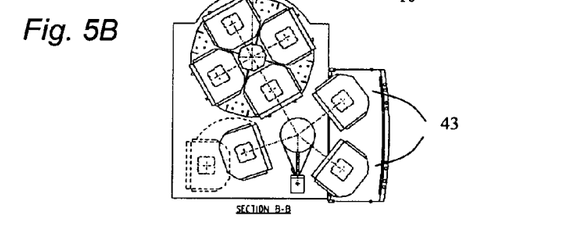
Figure 5C:
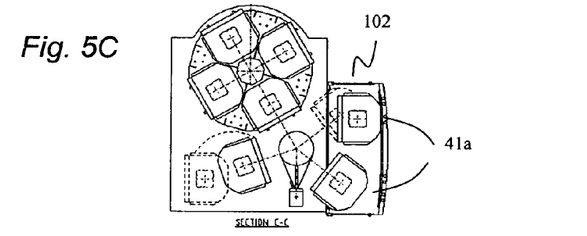
Figure 5D:
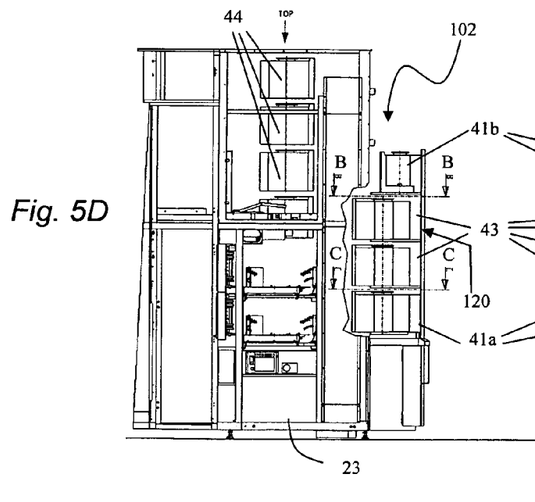
Figure 5E:
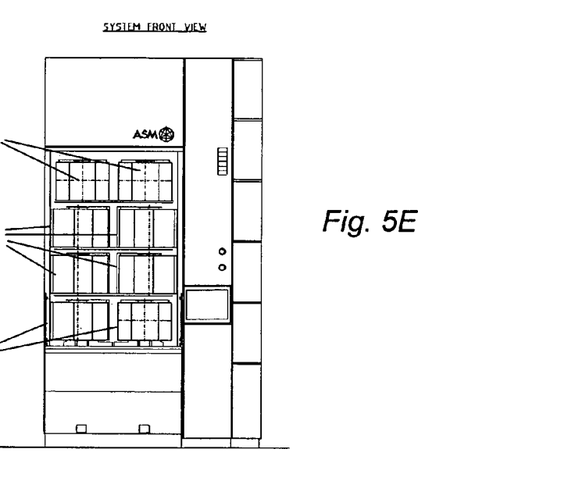

FIG. 5A is a top plan view of the front end 102 showing upper input/output positions 41b, FIG. 5B is a section along B-B and showing storage positions 43, FIG. 5C is a section along C-C showing lower input/output positions 41a. FIG. 5D is a side view and indicates the levels of the cross-sections B-B and C-C. On input/output positions 41a, 41b, the cassettes are placed by an operator, AGV or OHS in a coplanar orientation and can be rotated by a rotatable platform. On the storage positions 43, the cassettes are preferably placed in a rotated orientation, the side from which the wafers can be removed normal to the extension direction of the cassette handling device 31. As the cassettes may be placed and removed on the storage positions by the cassette handling device 31, there is no need or advantage in rotating the cassettes in a coplanar orientation. Therefore, a rotatable platform on the storage positions 43 or a rotatable end effector 32 on cassette handling device 31 may be omitted. FIG. 5E is a schematic front view. The cassettes on the storage positions 43 and the cassette on the lower left input/output position 41*a* are shown in a rotated orientation.

With continued reference to FIG. 5E, the front-end 102 can include two columns of input/output ports 41*a*, 41*b* and the storage positions 43. It will be appreciated that on some vertical levels both input/output ports and storage positions can be provided. In addition, it will be appreciated that each of the input/output ports 41*a*, 41*b* can also function as storage positions, as cassettes 10 can also be temporarily stored at those ports 41*a*, 41*b*.

For example, in some preferred embodiments, one single lower input/output port 41*a* can be provided, along with a storage position at the same vertical level. In the same preferred embodiments, two upper input/output ports 41*b* can be provided, with two pairs of storage positions 43 provided at two vertical levels between the upper input/output ports 41*b* and the lower input/output port 41*a*. During processing, the upper input/output ports 41*b* can be utilized for loading of cassettes 10 into the housing 103 during normal operation of the processing system 100, while the lower input/output port 41*a* is advantageously at a height accessible to human operators and can be used as input/output station during maintenance operations and as storage position during normal processing. To minimize system complexity and associated costs, an additional storage position 43, rather than a more complex second lower input/output port 41*a*, is preferably provided at the same vertical level as the lower input/output port 41*a*.

As operators need to be protected against interference with moving parts such as cassette handling device 31, storage positions 43 are separated from the clean room by a housing 120, and are preferably only accessed by cassette handling device 31 through an opening in partition 104. Lower input/output ports 41*a* are provided with closable openings 142 in partition 104, which is closed during placement or removal of the cassette by the operator and opens to allow gripping of the cassette by cassette handler device 31.

Cassettes 10 are transferred inside the housing 103 using a cassette handler 31, which is preferably a computer-controlled robot. The cassette handler 31 is disposed inside the housing 103 and moves the cassettes 10 inward, relative to the exterior of the housing. The cassette handler 31 is preferably a random access handler which can access cassettes 10 at any of the input/output ports 41*a*, 41*b*. It will be appreciated that cassettes 10 at pure storage positions 43 may need to be moved to an open input/output port 41*a*, 41*b* to allow transfer of those cassettes 10 out of the housing 103. Movement of cassettes outside of the housing 103 can be performed, e.g., using a robot (not shown) external to the housing 103, or by a human operator.

Movement of a cassette 10 inside the housing 103 transfers the cassette 10 into the cassette transfer region 23. The cassette transfer region 23 houses a cassette transfer mechanism. In the illustrated embodiment, the cassette transfer mechanism includes the cassette handler 31 and the cassette transfer platform 30. The cassette handler 31 includes an elevator 35 which allows access to the multiple rotary platforms 27 of the cassette store 8, and serves to transfer cassettes among the input/output ports 41*a*, 41*b*, the cassette store 8 and the cassette transfer platform 30. The cassette transfer platform 30, in turn, places cassettes into active communication with the interface 37 between the cassette transfer chamber 23 and the wafer handling chamber 22, through which the wafer handling robot 24 can remove or replace substrates, such as semiconductor wafers. The cassette transfer platform 30 can include two independently operable levels for independently moving two cassettes 10 to interface with two openings in the interface 37 (FIG. 3). It will be appreciated that the wafer handling robot 24 can move substrates between the cassettes 10 and wafer boats for holding the substrates during processing in furnaces 6, 7 (FIG. 4). In the illustrated embodiment, the cassette handler 31 transfers cassettes 10 onto store 8 with the side from which the wafers can be removed facing out, thus facilitating efficient storage on the round store 8 with narrow cassette ends facing the center of the rotary platforms 27. Similarly, cassette handler 31 transfers cassettes 10 onto transfer platform 30 with the side from which the wafers can be removed facing the cassette handler elevator 35. The cassette transfer platform 30 is therefore configured to turn cassettes received from the cassette handler 31 until the side from which the wafers can be removed faces the interface 37.

Movements within the cassette transfer region are controlled by a cassette handling controller, including a central processing unit (CPU) and program therefor. In particular, the cassette handling controller instructs all movement of the cassette handler 31, rotation of the rotary platforms within the cassette store 8, rotation of the cassette transfer platform 30 and rotation of cassettes 10 at the input/output station 40. Sensors are also connected to this controller to monitor the status of the cassette transfer process.

With continued reference to FIGS. 3 and 4, at least one additional interior storage position 44 can be provided in the cassette transfer region 23 in some preferred embodiments. Preferably, the interior storage positions 44 are disposed above, and particularly directly above, the cassette transfer platform 30. In some embodiments, the interior storage positions 44 are disposed directly above the position occupied by a cassette after first loading the cassette onto the platform 30 using the cassette handler 31 (FIG. 4). Advantageously, the interior storage positions 44 are also accessible by the cassette handler 31, which can be used to transfer cassettes to and from those positions 44. The interior storage positions 44 can include platforms, such as shelves, or other devices for supporting the cassettes 10. In some embodiments, up to four interior storage positions 44 can be provided above the cassette transfer platform 30. It will be appreciated that the interior storage positions 44 can be used to store some cassettes 10 in lieu of storage in the cassette store 8, or the interior storage positions 44 can be used as an intermediary storage position for cassettes 10 being transferred between the cassette store 8 and the cassette transfer platform 30. Preferably, the interior storage positions 44 can be accessed by the same cassette handler 31 used to access cassettes 10 at the input/output ports 41*a*, 41*b*.

Advantageously, the storage positions 44 allow efficient use of the interior volume of the housing by providing additional cassette storage capabilities in an otherwise empty volume. Moreover, the proximity of the storage positions 44 to the cassette transfer platform 30 can decrease the transfer time of cassettes 10 to the cassette transfer platform, thereby increasing the overall rate at which substrates can be loaded onto a wafer boat for processing in furnaces 6, 7. In some other embodiments, one or more of the storage positions can be employed as a position for a metrology tool (not shown), accessible from wafer handling chamber 22.

It will be appreciated by those skilled in the art that various omissions, additions and modifications may be made to the methods and apparatus described above without departing from the scope of the invention. All such modifications and changes are intended to fall within the scope of the invention, as defined by the appended claims.

We claim:

1. A semiconductor substrate processing system, comprising:
   a housing for separating the system from a surrounding clean room;
   a reactor within the housing; and
   a front-end for loading substrate cassettes into the housing, the front-end being disposed adjacent to and in front of the housing and comprising:
      a partition disposed between an interior of the housing and the surrounding clean room;
      at least one lower input/output port, each at least one lower input/output port having a lower openable closure in the partition, the lower openable closure allowing cassettes access from the clean room into the housing;
      at least one upper input/output port disposed above the at least one lower input/output port, each at least one upper input/output port having an upper openable closure in the partition, the upper openable closure allowing cassettes access from the clean room into the housing; and
      at least one cassette storage position disposed at a vertical level between the at least one lower input/output port and the at least one upper input/output port, the at least one storage position configured to receive cassettes transported into the housing,
      wherein one of the at least one lower input/output port, one of the at least one upper input/output port, and one of the at least one cassette storage position are arranged in a column along a same side of the partition.

2. The semiconductor substrate processing system of claim 1, further comprising a cassette handler within the housing, the cassette handler configured to transfer cassettes within the housing, wherein cassette accommodation positions at each of the at least one lower input/output port and the at least one upper input/output port are accessible by the cassette handler.

3. The semiconductor substrate processing system of claim 2, wherein cassette accommodation positions at the at least one storage position are accessible by the cassette handler.

4. The semiconductor substrate processing system of claim 1, wherein the at least one storage position, the at least one lower input/output port, and the at least one upper input/output port are vertically fixed relative to each other.

5. The semiconductor substrate processing system of claim 1, wherein the at least one cassette storage position consists of four cassette storage positions, the four cassette storage positions disposed on two vertical levels, with two cassette storage positions at each of the two vertical levels.

6. The semiconductor substrate processing system of claim 5, wherein the at least one lower input/output port consists of one input/output port and one storage position, the one storage position provided without an associated opening out of the housing at a same vertical level.

7. The semiconductor substrate processing system of claim 6, wherein the at least one upper input/output port consists of two input/output ports at a same vertical level.

8. The semiconductor substrate processing system of claim 7, wherein the four cassette storage positions are each provided without an associated opening out of the housing.

9. The semiconductor substrate processing system of claim 1, wherein the at least one storage position comprises a platform for supporting a cassette.

10. The semiconductor substrate processing system of claim 1, wherein the reactor comprises at least one vertical furnace.

11. The semiconductor substrate processing system of claim 1, wherein the reactor comprises two vertical furnaces.

12. The semiconductor substrate processing system of claim 1, further comprising:
   a cassette transfer region within the housing and adjacent to the front-end;
   a wafer handling chamber within the housing and adjacent to the cassette transfer region, the wafer handling chamber provided with a boat handling robot for loading and unloading boats and separated from the cassette transfer region by a partition; and
   a processing area within the housing and adjacent to the wafer handling chamber, the processing area separated from the wafer handling chamber by a partition, wherein the reactor is disposed in the processing area.

13. The semiconductor substrate processing system of claim 12, further comprising a cassette interface in the partition separating the wafer handling chamber and the cassette transfer region, the cassette interface having a closable opening sized and shaped to mate with the closure of a FOUP cassette and to open the closure of the FOUP cassette.

14. The semiconductor substrate processing system of claim 13, further comprising a wafer handling robot within the wafer handling chamber, the wafer handling robot configured to access substrates within cassettes through the opening of the interface.

15. The semiconductor substrate processing system of claim 14, further comprising a cassette store in the cassette transfer region.

16. The semiconductor substrate processing system of claim 15, wherein the store comprises a plurality of stacked rotary storage platforms, each platform divided into a plurality of storage compartments and defining cassette store positions.

17. The semiconductor substrate processing system of claim 15, further comprising a rotatable cassette transfer platform configured to provide the FOUP cassette to the cassette interface, further comprising at least one interior cassette storage position disposed apart from the cassette store and the cassette transfer platform.

18. The semiconductor substrate processing system of claim 17, wherein the at least one interior cassette storage position is disposed directly above the cassette transfer platform.

19. A loading station for a batch semiconductor fabrication system, comprising:
   a partition disposed between an interior of the housing and the surrounding clean room;
   a lower input/output port for holding a substrate cassette and having a lower openable closure in the partition, the lower openable closure allowing cassette access into the housing of the semiconductor fabrication system;
   an upper input/output port for holding a substrate cassette, the upper input/output port disposed above the lower input/output port and having an upper openable closure in the partition, the upper openable closure allowing cassette access into the housing; and
   at least one storage position for holding a substrate cassette, the at least one storage position disposed vertically between the lower input/output port and the upper input/output port,
   wherein one of the lower input/output port, one of the upper input/output port, and one of the at least one cassette storage position are arranged in a column along a same side of the partition.

20. The loading station of claim 19, wherein the lower input/output port, the upper input/output port and the at least one storage position are configured for access by a same cassette handling robot.

21. The loading station of claim 19, wherein the upper input/output port is at a maximum height permitted by the SEMI E15.1 standard.

22. The loading station of claim 19, wherein the lower input/output port is at a minimum height specified by the SEMI E15.1 standard for an operator accessible input/output port.

23. The loading station of claim 19, wherein the at least one storage position comprises storage positions at two vertical levels between the lower input/output port and the upper input/output port.

24. The loading station of claim 23, further comprising an additional lower input/output port at a same vertical level as the lower input/output port and an additional upper input/output port at a same vertical level as the upper input/output port.

25. The loading station of claim 24, further comprising two storage positions at each of the two vertical levels having storage positions.

26. The loading station of claim 19, wherein the at least one storage position comprises a laterally-protruding platform configured to support a cassette on an upper surface of the platform.

* * * * *